(12) United States Patent
Baier

(10) Patent No.: US 8,461,727 B2
(45) Date of Patent: Jun. 11, 2013

(54) METHOD AND APPARATUS FOR OPERATING AN ELECTRICAL APPLIANCE

(75) Inventor: Martin Baier, Ettlingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 443 days.

(21) Appl. No.: 12/888,602

(22) Filed: Sep. 23, 2010

(65) Prior Publication Data

US 2011/0074224 A1 Mar. 31, 2011

(30) Foreign Application Priority Data

Sep. 25, 2009 (DE) .......................... 10 2009 048 494

(51) Int. Cl.
*H05K 7/14* (2006.01)
(52) U.S. Cl.
USPC .......................................................... 307/149
(58) Field of Classification Search
USPC .......................................................... 307/149
See application file for complete search history.

(56) References Cited

U.S. PATENT DOCUMENTS

| | | | |
|---|---|---|---|
| 2,935,583 A | 5/1960 | Howell | |
| 3,711,672 A | 1/1973 | Moreland, II et al. | |
| 4,158,216 A | 6/1979 | Bigelow | |
| 4,233,593 A | 11/1980 | Bigelow | |
| 4,812,804 A | 3/1989 | Masaki | |
| 4,983,812 A | 1/1991 | Worrall et al. | |
| 5,373,125 A | 12/1994 | Ford et al. | |
| 5,646,587 A | 7/1997 | Miyazawa et al. | |
| 5,920,131 A | 7/1999 | Platt et al. | |
| 5,959,863 A | 9/1999 | Hoyt et al. | |
| 6,023,213 A | 2/2000 | Van Zeeland | |
| 6,153,837 A | 11/2000 | Garcia et al. | |
| 6,294,906 B1 | 9/2001 | Kuechler | |
| 6,498,326 B1 | 12/2002 | Knappe | |
| 6,812,435 B2 | 11/2004 | Schilling | |
| 6,838,785 B2 | 1/2005 | Schilling | |
| 6,966,781 B1 | 11/2005 | Bullinger et al. | |
| 7,069,090 B2 | 6/2006 | Huffington et al. | |

(Continued)

FOREIGN PATENT DOCUMENTS

| | | |
|---|---|---|
| DE | 10229629 A1 | 1/2004 |
| DE | 102 55 676 A1 | 6/2004 |
| DE | 102006030550 A1 | 1/2008 |
| EP | 1873609 A1 | 1/2008 |

OTHER PUBLICATIONS

Office Action from German Application No. 10 2009 048 494.9 dated Apr. 29, 2010.

(Continued)

*Primary Examiner* — Daniel Cavallari
(74) *Attorney, Agent, or Firm* — Alston & Bird LLP

(57) ABSTRACT

In a method for operating an electrical appliance such as a hob, the electrical appliance has a plurality of functional units, an operator control surface and a freely movable operator control element for mounting on the operator control surface, with a mounting point for the operator control element provided on the operator control surface for each functional unit. A sensor for a touch switch and a sensor for identifying the rotation of the operator control element are provided on the mounting point. The mounting of an operator control element on the mounting point is identified and evaluated as an activation indication of the associated functional unit. Subsequent rotation of the operator control element is identified and effects a change in the functional unit, with a functional state of the corresponding functional unit being maintained after the operator control element is removed from the mounting point.

17 Claims, 2 Drawing Sheets

U.S. PATENT DOCUMENTS

| | | |
|---|---|---|
| 7,504,598 B2 | 3/2009 | Weigold |
| 7,564,150 B2 | 7/2009 | Baier et al. |
| 7,642,673 B2 | 1/2010 | Baier |
| 2005/0189820 A1 | 9/2005 | Blumenthal et al. |

OTHER PUBLICATIONS

European Patent Office Search Report dated Feb. 28, 2012, for European Application No. EP10175030.

METHOD AND APPARATUS FOR OPERATING AN ELECTRICAL APPLIANCE

CROSS REFERENCE TO RELATED APPLICATIONS

This application claims priority to German Application Number 10 2009 048 494.9, filed on Sep. 25, 2009, the contents of which are incorporated by reference for all that it teaches.

FIELD OF THE INVENTION

The invention relates to a method for operating an electrical appliance and to a corresponding apparatus.

BACKGROUND OF THE INVENTION

U.S. Pat. Nos. 7,564,150 and 7,642,673 disclose operator control apparatuses in which an operator control element, which can move freely per se, can be mounted on a mounting point on an operator control surface of an electric hob for rotary operation. If the operator control element is mounted on the mounting point, an associated cooking point of the electric hob can be adjusted, for example in terms of power. If the operator control element is removed, the functional state of the cooking point cannot be changed.

SUMMARY

The invention is based on addressing the problem of providing a method of the type mentioned below and a corresponding apparatus for operating an electrical appliance, with which method and apparatus the problems of the prior art can be overcome and, in particular, convenient and versatile operator control of an electrical appliance is possible together with low structural complexity of the operator control apparatus.

This problem is solved in various embodiments by a method and an apparatus as claimed herein. Advantageous and preferred embodiments of the invention are the subject matter of the further claims and will be explained in greater detail in the text which follows. Some of the following features are described only for the method or only for the apparatus. However, irrespective of this, they should be applicable both for the method and for the apparatus. The wording of the claims is incorporated in the content of the description by express reference.

The electrical appliance has a plurality of functional units, for example a plurality of cooking points in the case of a hob, an operator control surface and at least one freely movable operator control element for mounting on the operator control surface. To this end, a marked mounting point is provided on the operator control surface for each functional unit, the operator control element being mounted on said mounting point for the purpose of operator control. Fewer operator control elements than mounting points are advantageously provided, and particularly preferably a single operator control element is provided. A sensor for a touch switch is provided on or beneath the mounting point, it being possible for the said sensor to be operated by the application of a finger in particular, and also a sensor for identifying the rotation or rotation position of the operator control element is provided on or beneath the mounting point. This can take place capacitively, as described in U.S. Pat. No. 7,564,150 for example, with a finger touching a sensor on the operator control element and this serving for the lower sensor to identify the rotation or rotation position. As an alternative, this can take place magnetically with Hall sensors, in accordance with U.S. Pat. No. 7,642,673.

Mounting of an operator control element on a mounting point is identified by one of the abovementioned sensors and is evaluated as enabling or selection of the associated functional unit or its input. A subsequent movement or rotation of the operator control element effects a change in the functional state of the functional unit, for example an adjustment in the power level upwards or downwards in the case of a cooking point. After the operator control element is removed from the mounting point, the functional state of the corresponding functional unit which is set at this time is maintained, that is to say continues to operate and is not switched off. The functional state is advantageously frozen, as it were, and, by way of example, the power can only be adjusted again by means of an operator control element being mounted.

Therefore, in the case of an electrical appliance with a plurality of functional units, it is firstly possible for fewer operator control elements to be required, and in an advantageous embodiment for only one single operator control element to be required. Nevertheless, all the functional units can be operated or set using a few or using one single operator control element, but only one after the other in the case of a single operator control element. However, this does not present a problem in practice since mostly only a single operator works at an electrical appliance, for example a hob, in any case and therefore the functional units or cooking points are operated only sequentially in any case.

In a particularly advantageous embodiment of the invention, the application of a finger to a mounting point on which there is no operator control element can be identified and the associated functional unit can be switched off. To this end, the above-mentioned sensor for the touch switch can be a capacitive sensor, as is known, for example, from U.S. Pat. No. 5,917,165 or else from the abovementioned document U.S. Pat. No. 7,564,150, which advantageously can be designed and activated such that it can identify not only the operator control element and rotation of the said operator control element but also the application of a finger. In a further advantageous embodiment of the invention, the two abovementioned sensors can then even be combined to form a single sensor. The advantage of this is that the application of a finger to the mounting point is sufficient to switch off a functional unit, which should be possible very quickly and almost intuitively under certain circumstances, said mounting point acting like a conventional touch switch in this case. Therefore, an operator control element does not need to be moved nor potentially interfere with a function of another functional unit.

In a further embodiment of the invention, the operator control element can have sensor means which are designed such that operation of the said operator control element when or after the operator control element is mounted on a mounting point is identified by associated sensors, in particular one of the abovementioned sensors. Sensor means of this kind on an operator control element are known from the abovementioned documents U.S. Pat. No. 7,564,150 or U.S. Pat. No. 7,642,673 and can be likewise in the form of capacitively operating touch switches in those documents. A signal from a touch switch or a touch switch surface on the operator control element can be coupled to a sensor beneath the mounting point by means of a capacitive coupling, and therefore the operation of the sensor means can be identified from beneath the mounting point. As a result, it is not yet possible for the functional unit to be set or adjusted by way of the mounted operator control element at the mounting point, but the sensor means first has to be operated beforehand. This is an additional safety measure against undesired unintentional adjustment of the functional unit.

In a further embodiment, provision may be made here for operation of the sensor means to have to be performed within a prespecified time of at most 10 seconds, preferably at most 3 to seconds, after the operator control element is mounted on a mounting point in order to effect a subsequent change in the functional state of the associated functional unit. If this does not take place in the prescribed time, the associated functional unit is alternatively either disabled again or even, if it was previously activated, switched off or deactivated. A switch-off or de-activation process can be indicated or accompanied by signals in each case.

In a yet further embodiment, provision can be made here for the associated functional unit to be switched off, without the operator control element being rotated or moved, by again operating the sensor means when an operator control element is mounted on a mounting point. As a result, in contrast with the above-described switching off of a functional unit by application of a finger to the mounting point, switch-off can also be performed without the operator control element having to be removed in order to expose the mounting point. Therefore, it is possible for a setting to be made on the functional unit at any time shortly after the operator control element is mounted on a mounting point and the sensor means is operated, without the sensor means having to be operated again. The functional unit is activated, specifically switched off, only when it is operated again.

In an alternative, somewhat simpler embodiment of the apparatus and primarily of the operator control element, the said operator control element can be designed without the above-described sensor means. Therefore, the operator control element can primarily be simpler and fewer sensors may possibly be used at the mounting point. In this case, it suffices to mount the operator control element on a mounting point, as it were, as a selection of the corresponding functional unit for subsequent setting or adjustment by rotation or movement of the operator control element. The functional unit can be switched off by the operator control element being removed from the mounting point again and a finger being placed on the said mounting point in order to switch off the said functional unit, as described above.

If the operator control element does not have any sensor means, provision can likewise be made, as a safety function, for the operator control element to have to be moved or rotated within a prespecified time of at most 10 seconds, preferably at most 3 to 5 seconds, after the operator control element is mounted on a mounting point, otherwise either the associated functional unit will be switched off or the entire electrical appliance will be switched off, as has been described above. It goes without saying that corresponding signalling processes can also be performed again in this case.

Firstly, provision can be made, in one embodiment of the invention, for a timer function to be integrated. A special mounting point can be provided for this, it being possible for a timer for the functional unit which was set last by the operator control element to be set by way of the said special mounting point when an operator control element is mounted on the said special mounting point.

Secondly, the operator control element can remain on the mounting point of the associated corresponding functional unit, and the function changes over, as it were, to a timer mode by operation of a changeover sensor means, in particular a special timer touch switch in the operator control surface, and a timer can be set or a corresponding pre-specified time can be made by moving or rotating the operator control element. The said pre-specified time can then be taken either as a final timer pre-specification after a few seconds or else after operation of a sensor means on the operator control element or after the changeover sensor means is operated once again for the timer input.

With regard to the structural embodiment of the operator control element and the operator control surface or the mounting point, incorporation by reference is firstly made explicitly to U.S. Pat. No. 7,564,150 and U.S. Pat. No. 7,642,673. In this case, a central capacitive sensor element can advantageously be provided in addition to sensors and/or sensor areas for identifying mounting and rotation of the operator control element and operation of a sensor means which may be provided, the said central capacitive sensor element solely being designed and functioning as a touch switch for identifying a finger being applied to the mounting point. Therefore, both this sensor and the other sensors can be particularly well designed for, and matched to their respective special function.

These and further features can be gathered not only from the claims, but also from the description and the drawings, where the individual features can be realized in each case by themselves or in combination in the form of subcombinations in an embodiment of the invention and in other fields and can constitute advantageous and inherently patentable embodiments for which protection is claimed here. The subdivision of the application into individual sections and subheadings do not restrict the general validity of the statements made thereunder.

BRIEF DESCRIPTION OF THE DRAWINGS

Exemplary embodiments of the invention are schematically illustrated in the drawings and will be explained in greater detail in the text which follows. In the drawings.

DETAILED DESCRIPTION

Figure 1:
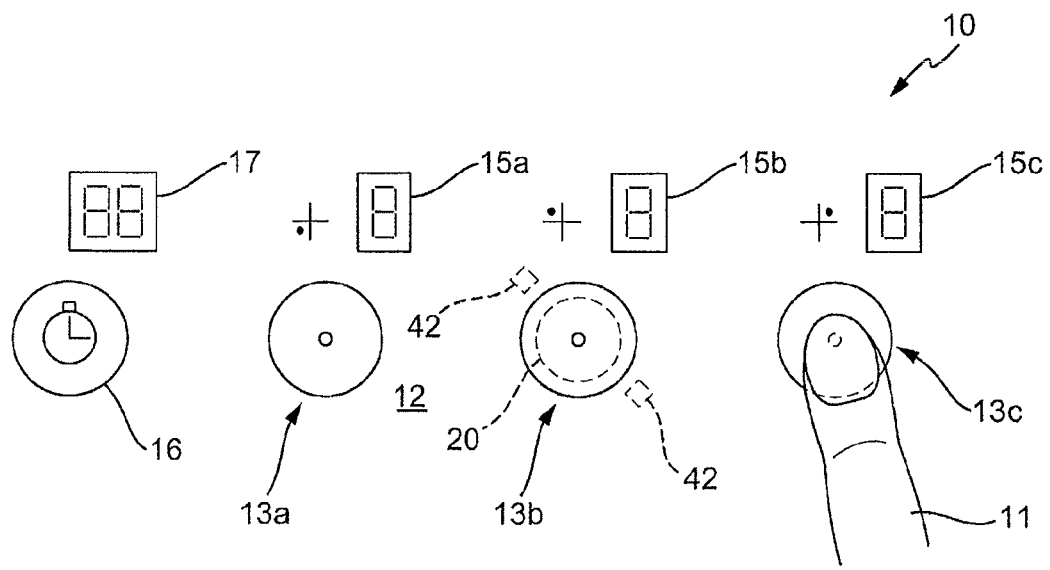
FIG. 1 shows a plan view of an operator control apparatus according to the invention, without an operator control element.

FIG. 1 illustrates an operator control apparatus 10 according to the invention on an operator control surface 12, with the operator control apparatus 10 being part of an electrical appliance, for example an electric hob. In one embodiment, the operator control surface 12 can be a glass-ceramic hob plate.

The operator control apparatus 10 has, on the operator control surface 12, three mounting points 13a to 13c which are each marked by an annular identifier and have a small ring in the centre. Other embodiments may have more or less mounting points. Displays 15a to 15c are arranged to the top-right of the mounting points 13, said displays being in the form of seven-segment displays. In the case of an electric hob as the electrical appliance and cooking points as the functional units, the said displays can be used to display the power levels of the said cooking points. Adjacent symbols which indicate which of the cooking points of the electric hob the respective mounting points 13 belong to and which cooking point can be operated by the said mounting point are illustrated to the left of the displays 15.

A timer switch 16 is provided to the left of the mounting point 13a and has a corresponding marking and is in the form of a customary capacitive touch switch. A two-digit timer display 17, which is again in the form of a customary seven-segment display, is provided above the said timer switch.

A lower magnet 20 and two Hall sensors 42 for identifying the direction of rotation are provided at the central mounting point 13b. This will be explained in greater detail below in relation to FIG. 2, with the lower magnet 20 corresponding to an otherwise customary sensor element of a capacitive touch switch. This is known from U.S. Pat. No. 7,642,673. On the right-hand side of FIG. 1, a finger 11 is applied to the mounting point 13c. This will also be explained in greater detail in the text which follows in relation to the operator control method.

Figure 2:
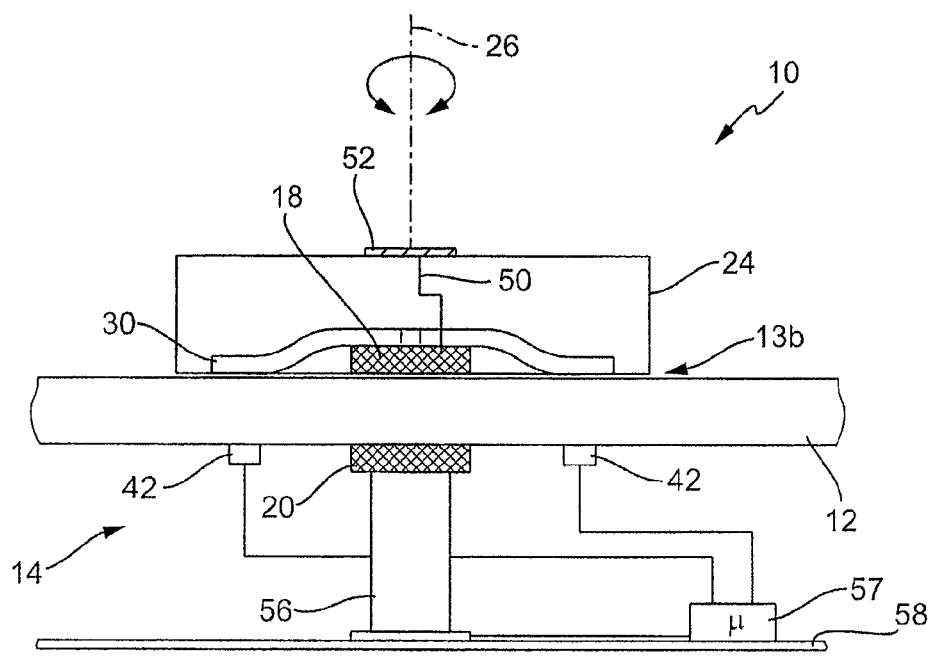
FIG. 2 shows a sectional illustration of an embodiment of an operator control apparatus according to the invention including an operator control element.

FIG. 2 shows the arrangement from FIG. 1 in sectional view. An operator control element 24 is provided on the operator control surface 12 of the operator control device 10, is in the form of a rotary knob and can be rotated about a rotation axis 26. The said operator control element is mounted by a central magnet 18 in the operator control element 24 and the opposite magnet 20 beneath the operator control surface 12. A sheet metal or metal star 30 runs above the magnet 18 in the operator control element 24. The said star has, for example, five arms and is connected to the magnet 18 in such a way that the individual arms of the metal star 30 are likewise magnetic. The rotation position can be determined in a known manner using Hall sensors 42 beneath the operator control surface 12, as is known, for example, from U.S. Pat. No. 7,642,673 to which reference is explicitly made in this respect.

The magnet 18 is electrically conductively connected to an electrically conductive planar touch sensor 52 on the upper face of the operator control element 24 by way of a connection 50 (illustrated by way of a dashed line). This illustration is merely schematic, various arrangements of touch sensors 52 at various points are possible, as are a plurality of touch sensors.

The lower magnet 20 is electrically connected to a control system 57, comprising a microprocessor, on a printed circuit board 58 by means of an elastic and electrically conductive, plastic or elastic body 56. The Hall sensors 42 are also connected to this control system 57.

If an operator now touches the touch sensor 52, this creates an electrical connection between the touch sensor and the central magnet 18. This can be passed to the control system 57 by means of a capacitive coupling between the magnets 18 and 20, which operate as electrically conductive surfaces, and the electrical connection 56. Therefore, the said control system can identify that one of the touch sensors is being touched through the operator control surface 12 in accordance with the operating principle of a capacitive touch sensor, as described, for example, in U.S. Pat. No. 5,917,165 or U.S. Pat. No. 7,642,673, which was previously identified. Since the operator control element 24 always rotates about its central axis 26 and therefore the two magnets 18 and 20 do not move away from one another, the association is the same in each direction of rotation and contact is always identified. Therefore, in this case, the touch sensor 52, in interaction with the magnet 18 is the abovementioned sensor means, to be precise in the form of a touch switch.

The shown points on the operator control element 24 at which the touch sensor 52 is fitted can depend on the respective intended use. Providing the touch sensor 52 in the centre has the advantage that, in addition to very good separate operation similar to a normal touch switch without rotary movement, operation is possible with simultaneous rotation even for small angles of rotation.

Figure 3:
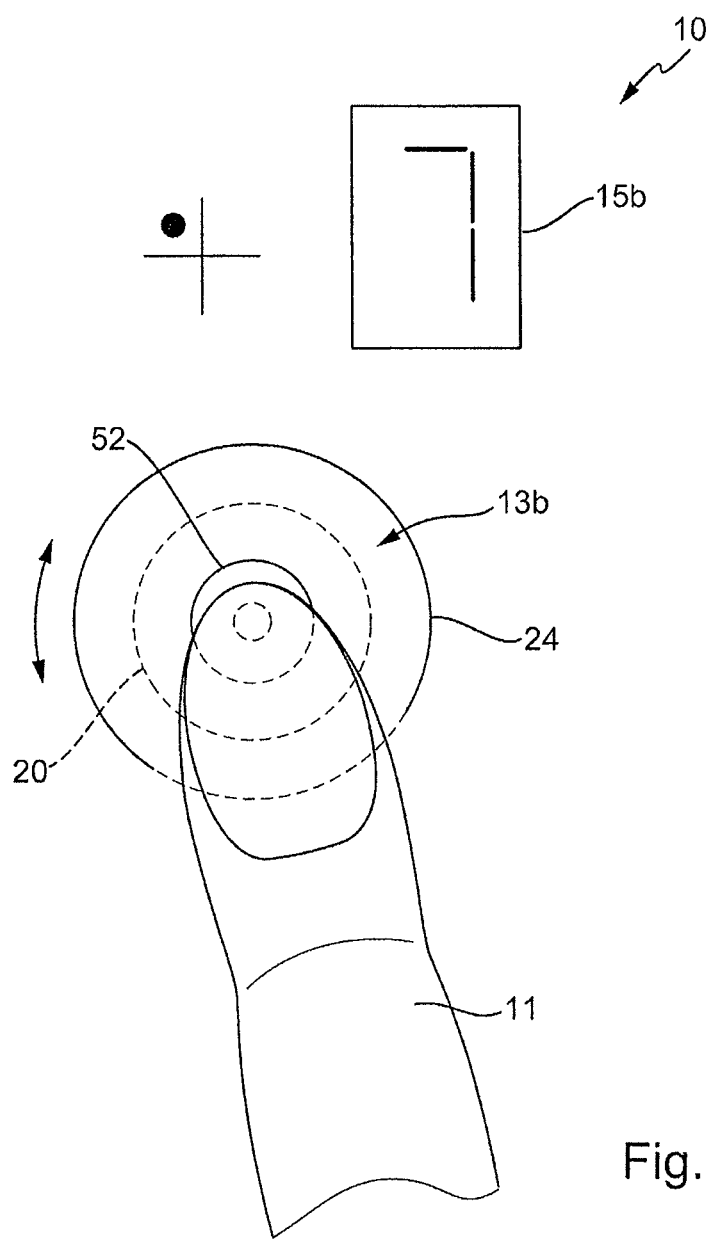
FIG. 3 shows a plan view of the operator control apparatus from FIG. 1 with an operator control element mounted on it in accordance with FIG. 2, with a finger placed on the said operator control element.

FIG. 3 illustrates, in a plan view, how the operator control element 24, which is the only operator control element of the operator control apparatus 10, is mounted on the mounting point 13b. As has been explained previously, mounting of the operator control element 24 on the mounting point 13b can be identified by the operator control apparatus 10 or the control system 57, for example, because the Hall sensors 42 can detect the magnetic field of the operator control element 24, or at the lower magnet 20 as a capacitive sensor element. According to one embodiment of the invention, even mounting the operator control element 24 on the mounting point 13b suffices for the corresponding cooking point to be selected and the power of the said cooking point then to be able to be adjusted. This is done by rotating the operator control element 24 by hand. The display 15b in FIG. 3 shows that power level "7" has now been set. Therefore, the corresponding cooking point can now be either operated immediately at power level "7" or, alternatively, the touch sensor 52, as the sensor means, first has to be operated by the finger 11 again, it being possible for this to be identified by the control system 57 by means of the capacitive coupling to the magnets 18 and 20, so that operation starts.

If the operator control element 24 now remains on the mounting point 13b, the power level of the corresponding associated cooking point can be changed at any time by rotation in one of the two directions. If, in the meantime, another cooking point is to be switched off because it is no longer required, the finger 11 can, for example according to FIG. 1, be placed on the corresponding mounting point 13c and over the capacitive sensor element, which is provided beneath it, in the form of the corresponding lower magnet. The control system 57 likewise identifies this and can then switch off the corresponding cooking point. Therefore, it is possible to switch off a cooking point without moving the operator control element 24 and even without using said operator control element at all. This increases both operational reliability and operator convenience.

If the cooking point associated with the mounting point 13b is to be switched off, provision may be made for the touch sensor 52 to be operated again. Therefore, the operator control element 24 does not need to be removed in order to be able to place a finger directly on the operator control surface 12, as has been described previously. Therefore, a cooking point which is associated with a mounting point 13 can be switched off in two ways.

If a timer setting is to be made for the cooking point which is associated with the mounting point 13b, a finger 11 can be placed on the far left of the timer switch 16. To this end, the timer display 17 can, for example, flash as an indication that a timer setting can now be made. The operator control element 24 which is located on the mounting point 13b can now be either directly rotated since the control system 57 is now in a timer setting mode after operation of the timer switch 16, and rotation of the operator control element only sets the timer and not the power. Therefore, a timer time can be set by rotating the operator control element 24 and, after setting, can be confirmed, for example, by operating the touch sensor 52, and implemented. For the duration of the timer setting, the corresponding display 15b of the mounting point 13b can also be lit in a specific way in order to once again indicate that the timer is currently being set for the corresponding cooking point. However, this is not necessary since it is clear from the position of the operator control element 24 as to which mounting point 13, and therefore which cooking point, is involved. After the timer setting is implemented, the control system 57 then switches back to normal mode in which rotation of the operator control element 24 effects a change in the power level.

As has been explained above, further safety precautions can be incorporated in the operator control method or control system 57. Therefore, provision can be made, for example, for the operator control element 24 to have to be rotated or the touch sensor 52, as the sensor means, to have to be operated within a time of, for example, 5 to 10 seconds after the operator control element 24 is mounted, otherwise a fault signal is produced or the corresponding cooking point or the entire appliance is switched off. In a further embodiment of an operator control apparatus 10, there is no requirement for a separate timer display 17, but for the displays 15 to be used for this purpose and to be correspondingly designed, in particular to be of two-digit design. In this case, the timer setting can be read directly from the mounting point 13.

As a yet further safety device according to the invention, provision may be made for the basic functional setting and functional state of a mounting point 13 to be maintained after removal of the operator control element from this mounting point. However, if the operator control element 24 is not mounted on another mounting point 13 within a pre-specified time of, for example, 5 or 10 seconds or more, this can be identified as a fault or a desire to switch off and secure the appliance, and the appliance is correspondingly switched off. This ensures, for example for child safety purposes, firstly that no adjustments can be made when the operator control element 24 is removed and secondly that the appliance is completely switched off.

The invention claimed is:

1. A method for operating an electrical appliance comprising a plurality of functional units, an operator control surface, at least one freely movable and removable operator control element for mounting on said operator control surface, a plurality of marked mounting points provided on said operator control surface wherein each mounting point is associated with one of said plurality of functional units, each marked mounting point for mounting by said operator control element, a first sensor for a touch switch, and a second sensor for identifying a rotation or a rotational position of said operator control element provided on or beneath each mounting point, said method comprising the steps of:
   mounting said movable operator control element on a particular mounting point;
   identifying said mounting as activation of one of said plurality of functional units associated with said particular mounting point;
   determining a subsequent rotation of said operator control element; and
   changing a functional state of an associated functional unit comprising said one of said plurality of functional units based on said rotation, wherein said functional state of said one of said plurality of functional units is maintained after said operator control element is removed from said particular mounting point.

2. The method according to claim 1, wherein application of a finger on another mounting point without said operator control element on said another mounting point is identified and further comprises the step of:
   de-activating a functional unit associated with said another mounting point.

3. The method according to claim 1, wherein said operator control element has sensor means and wherein an operation of said sensor means when said operator control element is mounted on said particular mounting point is identified by an associated second sensor beneath said particular mounting point.

4. The method according to claim 3, wherein the step of changing said functional state of said one of said plurality of functional units is associated with said particular mounting point being enabled after operation of said sensor means.

5. The method according to claim 3, wherein if said sensor means is operated within a pre-specified time of at most 10 seconds after said operator control element is mounted on said particular mounting point then said functional state of said associated functional unit is changed, otherwise said associated functional unit otherwise is switched off.

6. The method according to claim 3, further comprising the steps of:
   mounting said operator control element on one of said mounting points;
   operating said sensor means a second time; and
   deactivating said one of said plurality of functional units in response to operating said sensor means said second time.

7. The method according to claim 1, wherein said electrical appliance has a single operator control element.

8. The method according to claim 7, wherein all said mounting points for said functional units are of identical design.

9. The method according to claim 1, wherein said electrical appliance is a hob having a plurality of cooking points as functional units.

10. The method according to claim 1, wherein said operator control element has to be moved or rotated within a prespecified time of at most 10 seconds after said operator control element is mounted on said particular mounting point in order to effect a subsequent change in said functional state of said associated functional units, wherein said associated functional units otherwise is switched-off.

11. The method according to claim 1, wherein a timer for one of said plurality of functional units is employed together with said particular mounting point and said operator control element which is mounted on said mounting point.

12. The method according to claim 11, wherein said mounting point for a functional unit changes to a timer mode by operation of a changeover sensor means for the purpose of inputting a timer value.

13. The method according to claim 12, wherein said changeover sensor means is a touch switch on said operator control surface.

14. The method according to claim 1, wherein a basic functional setting and said functional state of said particular mounting point is maintained after removal of said operator control element from said mounting point, wherein if said operator control element is not mounted on another mounting point within a prespecified time of 5 seconds or more, a controller determines either a fault condition or an input to switch-off and secure said electrical appliance, and said electrical appliance is correspondingly switched off.

15. An apparatus for an electrical appliance comprising:
   a controller;
   a plurality of functional units controlled by said controller;
   an operator control surface, further comprising a plurality of marked mounting points, wherein each marked mount point corresponds to one of the plurality of functional units;
   at least one removable operator control element for mounting on said operator control surface;
   a first sensor for a touch switch; and a second sensor identifying a rotation or rotational position of said operator control element, wherein said second sensor is located on or beneath a particular mounting point, wherein said first sensor and said second sensor identify mounting of said operator control element on said particular mounting point, activating an associated functional unit, and subsequently identify a rotation of said operator control element to said controller in order to effect a change in a functional state of said functional unit, wherein said functional state of said corresponding functional unit is maintained after said operator control element is removed from said particular mounting point.

16. The apparatus according to claim 15, wherein said electrical appliance has one single operator control element.

17. The apparatus according to claim 16, wherein all said mounting points for said associated functional units are of identical design.

* * * * *